(12) United States Patent
Choroszucha et al.

(10) Patent No.: US 11,965,943 B2
(45) Date of Patent: Apr. 23, 2024

(54) BIAS FIELD CONTROL OF TOTAL-FIELD OPTICALLY PUMPED MAGNETOMETERS (OPMS) FOR IMPROVED DETECTION

(71) Applicant: Raytheon Company, Tewksbury, MA (US)

(72) Inventors: Richard B. Choroszucha, Tucson, AZ (US); George G. Descamps, Sahuarita, AZ (US); James T. Landon, Marana, AZ (US)

(73) Assignee: Raytheon Company, Tewksbury, MA (US)

( * ) Notice: Subject to any disclaimer, the term of this patent is extended or adjusted under 35 U.S.C. 154(b) by 28 days.

(21) Appl. No.: 17/722,017

(22) Filed: Apr. 15, 2022

(65) Prior Publication Data

US 2023/0333178 A1 Oct. 19, 2023

(51) Int. Cl.
*G01R 33/26* (2006.01)
*G01R 33/032* (2006.01)

(52) U.S. Cl.
CPC .......... *G01R 33/26* (2013.01); *G01R 33/032* (2013.01)

(58) Field of Classification Search
CPC .............................. G01R 33/26; G01R 33/032
See application file for complete search history.

(56) References Cited

U.S. PATENT DOCUMENTS 5,227,722 A 7/1993 Kostyk et al.
10,243,325 B2 3/2019 Shah
2016/0116553 A1 4/2016 Kim et al.
2018/0210039 A1* 7/2018 Shalev .................. G01V 3/081
2018/0292474 A1 10/2018 Raz

OTHER PUBLICATIONS

"G-824A Cesium Magnetometer Operation Manual P/N 27731-OM, Revision A8", Geometrics, Inc., (2015), 65 pgs.
"Orientation-Independent Optically Pumped Magnetometers:Total Field Sensors Without Dead Zones", Quantum Magnetics, Inc . . . Prepared Under Contract No. N00014-93-C-0272, (1994), 103 pgs.
"QTFM Gen-2 Operation", QuSpin, (Accessed Apr. 5, 2022), 2 pgs.
"Short Review of Optically Pumped Scalar Magnetometers", GEM Systems, Inc., (May 10, 2002), 3 pgs.
Edelstein, Alan, "Advances in magnetometry", J. Phys.: Condens. Matter 19, 165217, (2007), 28 pgs.

(Continued)

*Primary Examiner* — Jay Patidar
(74) *Attorney, Agent, or Firm* — Schwegman Lundberg & Woessner, P.A.

(57) ABSTRACT

A controllable bias field Bbias is applied to a single total-field OPM to maintain signal lock when an observable magnetic field Bmeas enters the OPM's dead zone. One or more electromagnetic (EM) coils are placed in proximity to the single OPM. Based on either a calibration of the field or a measured signal strength, a current command is calculated and applied to the one or more coils to produce the bias field Bbias to lift the observable magnetic field Bmeas out of the dead zone. The bias level is updated at a rate sufficient to maintain signal lock without interfering with the operation of the OPM. This allows a single OPM to sense the observable magnetic field Bmeas in all directions without having to either re-orient the OPM or to use multiple orthogonally positioned OPMs.

19 Claims, 12 Drawing Sheets

(56) References Cited

OTHER PUBLICATIONS

Groger, S, et al., "Design and Performance of Laser-Pumped Cs-Magnetometers for the Planned UCN EDM Experiment at PSI", J. Res. Natl. Inst. Stand. Technol. 110(3), (2005), 179-183.

Hrvoic, Ivan, et al., "Brief Review of Quantum Magnetometers", GEM Systems, Inc., (Aug. 21, 2002), 16 pgs.

Lindseth, B, et al., "Non-Contact Measurement of Cardiac Electromagnetic Field in Mice by Use of a Microfabricated Atomic Magnetometer", Computers in Cardiology, 34, (2007), 443-446.

Prouty, Mark, "Real-Time Hand-Held Magnetometer Array. SERDP Project MR-2104", Geometrics, Inc., (Apr. 2016), 112 pgs.

Seltzer, S, et al., "Unshielded three-axis vector operation of a spin-exchange-relaxation-free atomic magnetometer", Applied Physics Letters, vol. 85, No. 20, (Nov. 2004), 4804-4806.

Sutter, Jens, et al., "Recording the heartbeat of cattle using a gradiometer system of optically pumped magnetometers", Computers and Electronics in Agriculture 177,, (2020), 8 pgs.

Vasconcelos, J, et al., "Geometric Approach to Strapdown Magnetometer Calibration in Sensor Frame", IEEE Transactions on Aerospace and Electronic Systems vol. 47, No. 2, (Apr. 2011), 1293-1306.

Yin, Yan, et al., "Comprehensive influence of modulated and bias magnetic fields on an atomic magnetometer", Meas. Sci. Technol. 32, 055004, (2021), 6 pgs.

"International Application Serial No. PCT US2023 013115, International Search Report dated May 30, 2023", 3 pgs.

"International Application Serial No. PCT US2023 013115, Written Opinion dated May 30, 2023", 7 pgs.

\* cited by examiner

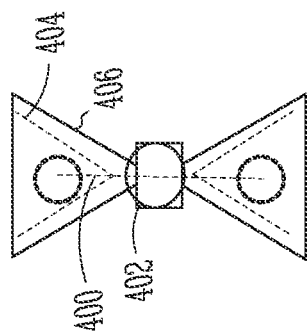
Fig. 6D
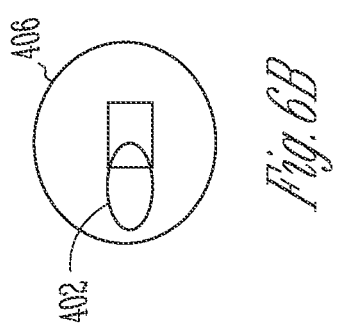
Fig. 6B
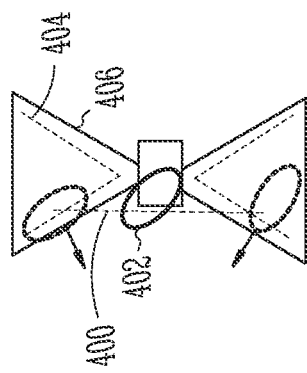
Fig. 6C
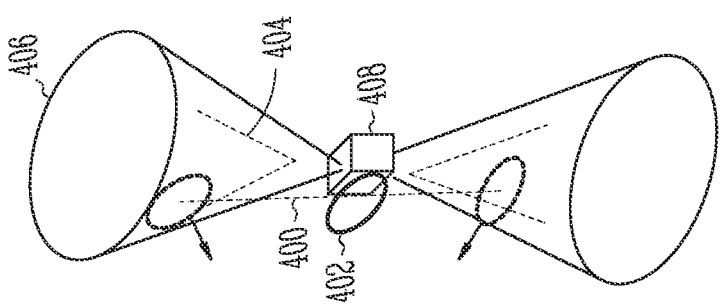
Fig. 6A
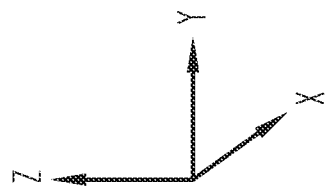

BIAS FIELD CONTROL OF TOTAL-FIELD OPTICALLY PUMPED MAGNETOMETERS (OPMS) FOR IMPROVED DETECTION

BACKGROUND OF THE INVENTION

Field of the Invention

This invention relates to total-field optically pumped magnetometers (OPMs), and more particular to a system and method to address dead zone limitations of OPMs.

Description of the Related Art

A magnetometer is a device that measures a magnetic field. Magnetometers are widely used to measure the Earth's magnetic field. There are two basic types of mangnetomer measurement: vector magnetometers measure the vector components of a magnetic field; and total field or scalar magnetometers measure the magnitude of the vector field. A compass is a simple type of magnetometer that measures the declination of the field in a local level frame.

As described on page 1 of a Final Report prepared under Contract No. N00014-93-C-0272 for The Office of Naval Research entitled "Orientation-Independent Optically Pumped Magnetometers: Total Field Sensors Without Dead Zones" on Apr. 28, 1994 "Optically Pumped Magnetometers (OPMs) are among the most sensitive magnetometers available. In addition, OPMs are total-field sensors they measure the magnitude of the ambient magnetic field rather than its vector components. The total-field measurement greatly reduces noise when the magnetometer is deployed on a moving platform.

Although the measured total field varies only weakly with orientation, OPMs are orientation dependent in a different sense: the noise in the magnetic measurement varies strongly with the angle between the ambient magnetic field and the optical axis of the instrument. For a given OPM in a given application, there will be a range of solid angle in which the noise level is unacceptable. This range of angles is called a dead zone.

These dead zones create restrictions that reduce the usefulness of the OPM. In a handheld instrument, the dead zones force the operator to orient the instrument in a particular way with respect to the ambient magnetic field. If the OPM is mounted on an airplane or towed vehicle, the dead zones force the sensor platform to avoid certain directions of travel. To accommodate the dead zones, some magnetometer systems actually use three independent sensors oriented along three orthogonal axes. This approach eliminates restrictions on platform heading, but increases the weight, cost, complexity, and power consumption of the OPM. Eliminating the dead zones altogether would make it possible to avoid orientational restrictions without using multiple sensor units. OPMs would be made smaller, lighter, less expensive, and easier to use.

The dead zones in conventional OPMs arise inherently from the optical technique that is used to measure the ambient magnetic field. In this technique, special optical absorption process, called optical pumping, is used to align the atomic spins of alkali atoms with the ambient magnetic field. The atomic spins are then manipulated by using a radio-frequency (RF) field to stimulate the Larmor precession of the atomic spins about the ambient field. The change in spin alignment is observed by monitoring the optical absorption. By combining these processes, it is possible to determine the Larmor precession frequency, which is proportional to the intensity of the ambient magnetic field. OPMs using this approach have dead zones because the optical pumping is only effective when the optical pump beam has a sufficient component along the ambient field."

An exemplary embodiment of a total-field OPM is Quspin's STEM Gen-2 pulsed, rubidium OPM based on an optical detection scheme called Free Induction Decay (HD) as described at www.quspin.com, Quspin describes the underlying physics and operation of the STFM Gen-2 as follows below. FIG. 1 shows the optical schematic of the magnetometer sensor head 10. First, light 12 from a 795 nm VCSEL, laser 14 is circularly polarized using a quarter waveplate 16. Next, the circularly polarized light passes through a transparent rubidium vapor cell 18. After passing through the vapor cell, the light is captured by a photodetector 20. The vapor cell is electrically heated to roughly 80 deg. C. to increase the rubidium vapor pressure and the laser wavelength is electronically locked to the rubidium D1 optical transition.

As described by Quspin, sensor operation is divided into two phases that repeat every 1 ms (cycle time). For the first 500 us, a strong polarizing magnetic field (Bp) parallel to the light beam is turned on using a set of Helmholtz coils 22 enveloping the vapor cell. The combination of the light beam and the longitudinal polarizing field causes the rubidium atoms to become spin-polarized (aligned with the polarization field). Next, the polarizing field is rapidly turned off in less than 1 us. Once the polarization field is turned off, the measurement phase begins.

Rapidly switching off the polarization field causes the rubidium atoms to precess (oscillate) about the ambient magnetic field. The rubidium precession frequency is directly proportional to the magnitude of the ambient magnetic field. The precessing rubidium atoms modulate the light passing through the vapor cell which enables real-time observation of the atomic precession, for example using the amplified photodiode output plugged into an oscilloscope. In QTFM Gen-2 (M), the precession lasts for about 500 us and constitutes the measurement phase of the cycle.

During the measurement phase, the raw electrical output from the photodiode is amplified and sent to a built-in high-performance frequency counter. The frequency counter measures the rubidium precession frequency and infers the accurate value of the ambient magnetic field thanks to the fixed relationship between background magnetic field and precession frequency given by 6.998 nT/Hz (the Larmor frequency). As an example, if the precession frequency is found to be 350 kHz, the background field is determined to be 50014.289 nT. In each 1 ms cycle, one magnetic field measurement is made.

The precession frequency depends only on the magnitude of the ambient magnetic field [$\sqrt{(B_x^2+B_y^2+B_z^2)}$, and not on the individual field vector components of the field ($B_x$, $B_y$, $B_z$). For this reason, the QTFM-Gen 2(M) is a scalar or "total-field" magnetometer.

Referring now to FIGS. 2A-2C, different configurations of an OPM sensor exhibit equatorial, polar and equatorial-polar dead zones 32, 34 and 36, respectively, in an XYZ coordinate space. Equatorial dead zone 32 is defined by the volume in space that is greater than angle theta $\theta 1$ from the Z-axis from the origin (0,0,0) at the sensor 30 in both the positive and negative Z directions. Alternately, a cone with a half angle of 90-$\theta 1$ is rotated in the equatorial plane (the XY plane) about the Z-axis to form the dead zone. This is equivalent to an observable magnetic field Bmeas being detectable if the inequality $$\cos(\theta_1) \leq \frac{|\langle B_{meas}, \hat{Z}\rangle|}{\|B_{meas}\|}$$

is satisfied. The QTFM Gen-2 sensor exhibits the equatorial dead zone 32. A detection zone 40 is a cone about the Z-axis ($\hat{Z}$) that is less than angle theta $\theta_1$. The polar dead zone 34 is defined by a pair of cones about the Z-axis that is less than angle θ2 in both directions from the origin (0,0,0). A detection zone 42 is the remaining volume outside of the cones. This is equivalent to $B_{meas}$ being detectable if the inequality $$\cos(\theta_1) \geq \frac{|\langle B_{meas}, \hat{Z}\rangle|}{\|B_{meas}\|}$$

is satisfied. Equatorial-polar dead zone 36 is the union of the equatorial and polar dead zones 32 and 34. A detection zone 44 commonly referred to as the "Active Zone" is the annular conic volume that is greater than theta θ2 and less than theta θ1. This is equivalent to Bmeas being detectable if the inequality $$\cos(\theta_1) \leq \frac{|\langle B_{meas}, \hat{Z}\rangle|}{\|B_{meas}\|} \leq \cos(\theta_2)$$

is satisfied. Cesium-vapor OPMs may exhibit an Active Zone.

As described at page 2 of the ONR Final Report the "goal was to develop a new OPM with no dead zones. This Orientation-Independent Optically Pumped Magnetometer (OIOPM) will use a new optical pumping technique that does not depend on the orientation of the optical axis with respect to the ambient field. In essence, this new technique separates the optical pumping from the actual magnetic measurement. We do the optical pumping in the presence of an applied magnetic field, which we adjust so that it lies along the pump beam. We remove this applied field adiabatically, in such a way that the optically pumped atoms end up aligned with the ambient magnetic field. We then manipulate the atomic spins as in a conventional OPM, using an RF field to stimulate the Larmor precession of the atoms. We finally observe the effect of the RF field by adiabatically restoring the applied field and repeating the optical pumping process. Thus, by making optical measurements in an applied field that is aligned with our optical apparatus, we can observe a physical process which depends on the Larmor frequency of the atoms in the ambient earth's field."

U.S. Pat. No. 5,227,722 entitled "Dead-Zone Free Optically Pumped Mz Magnetometer" issued Jul. 13, 1993 discloses "a gas cell, preferably in the shape of a hemisphere, that forms a transparent enclosure for helium or an alkali metal vapour. A coil forms an A.C. magnetic field H1 in the enclosure, the magnetic field having multi-directional field lines. A lamp or lamps, comprising either helium or alkali metal vapour, direct circularly polarized resonance radiation at the enclosure such that the radiation rays travelling through the enclosure are multi-directional. A photodetector or photodetectors detect the radiation rays after they have passed through the gas cell. The multi-directionality of the radiation rays and the A.C. magnetic field H1 ensures that the magnetometer will not possess dead-zones."

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a controllable bias field Bbias to a single total-field OPM to maintain signal lock when an observable magnetic field Bmeas enters the OPM's dead zone.

One or more electromagnetic (EM) coils are placed in proximity to a single OPM. Based on either a calibration of the field or a measured signal strength, a current command is calculated and applied to the one or more EM Coils to produce the bias field Bbias to lift the observable magnetic field Bmeas out of the dead zone. The bias level is updated at a rate sufficient to maintain signal lock. This allows a single OPM to sense the observable magnetic field Bmeas in all directions without having to either re-orient the OPM or to use multiple orthogonally positioned OPMs.

In an embodiment, a single EM coil is positioned proximate the single OPM such that when energized the EM coil produces a bias magnetic field. Bbias that is substantially parallel to an axis of a detection zone (orthogonal to an axis of a dead zone) in a local volume around the OPM to move an observable field Bmeas from the dead zone into the detection zone. Bbias is updated at a rate sufficient to maintain Bmeas in the detection zone while not interfering with operation of the OPM. In one configuration, the detection zone is a cone about the Z-axis and the dead zone is an equatorial dead zone in the XY plane in which a cone is rotated about the Z-axis. Bbias moves Bmeas along the Z-axis out of the equatorial dead zone. In another configuration, the dead zone is a polar dead zone that is cone about the Z-axis and the detection zone is a cone rotated about the Z-axis in the XY plane. Bbias can move Bmeas either along the Z-axis or more preferably in the XY plane out of the polar dead zone. In another configuration, an intersection of the equatorial and polar dead zones produces an Active Zone for which one and preferably two or more orthogonal EMs may be used to move Bmeas out of either dead zone.

In another embodiment, two or more EMs coils are positioned proximate the single OPM such that when energized the EM coils produce orthogonal bias magnetic fields Bbias,1, Bbias,2 and Bbias,3, for example. This may allow for lower total current levels (less power) to be required to move Bmeas out of the dead zone.

In an embodiment, current control logic is responsive to calibration parameters including soft iron M and hard iron C that characterize a platform on which the OPM is mounted and a definition of the dead zone to compute Bbias to move Bmeas into the detection zone. Bbias may be computed for any possible attitude of the OPM or, if an attitude measurement is available, for that specific attitude. The later approach may reduce overall power requirements to maintain signal lock but is more susceptible to rapid changes in attitude that might lose signal lock. A current control circuit is responsive to the computed bias to generate a current to energize the EM coil.

In another embodiment, current control logic that implements a search along the axis responsive to detected signal strength to determine a level of Bbias,1 that satisfies a signal strength criteria (e.g. exceeds a threshold or satisfies a local maximum) to move Bmeas into the detection zone. A current control circuit is responsive to the computed bias to generate a current to energize the EM coil. The "search" may be conducted in many different ways including but not limited to providing currents that bounce back and forth between positive and negative bias less that either move outward from a minimum bias or inward from a maximum bias or applying some type of optimized search algorithm such as PID (Proportional Integral Derivative).

In a particular embodiment, a single total-field OPM is mounted on a platform and is characterized by a detection zone along a Z-axis and an equatorial dead zone orthogonal to the Z-axis with a boundary separating the detection and dead zones defined by an angle theta θ1 from the Z-axis in an XYZ coordinate space. A single EM coil is positioned proximate the OPM and oriented such that when energized the single EM coil produces a bias magnetic field Bbias that is substantially parallel to the Z-axis in a local volume around the OPM to move a Z-component of an observable field Bmeas up or down in the Z direction to move Bmeas from the equatorial dead zone into the detection zone. Current control logic is responsive to calibration parameters including soft iron M and hard iron C of the platform and a definition of the dead zone to compute a minimum required Bbias to move Bmeas into the detection zone for any possible attitude of the OPM. A current control circuit is responsive to the computed bias to generate a current to energize the first EM coil.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 6A-6D are perspective, top, front and side views of the application of the optimized bias to move the observable magnetic field Bmeas from the equatorial dead zone into the detection zone;

DETAILED DESCRIPTION OF THE INVENTION

Figure 1:
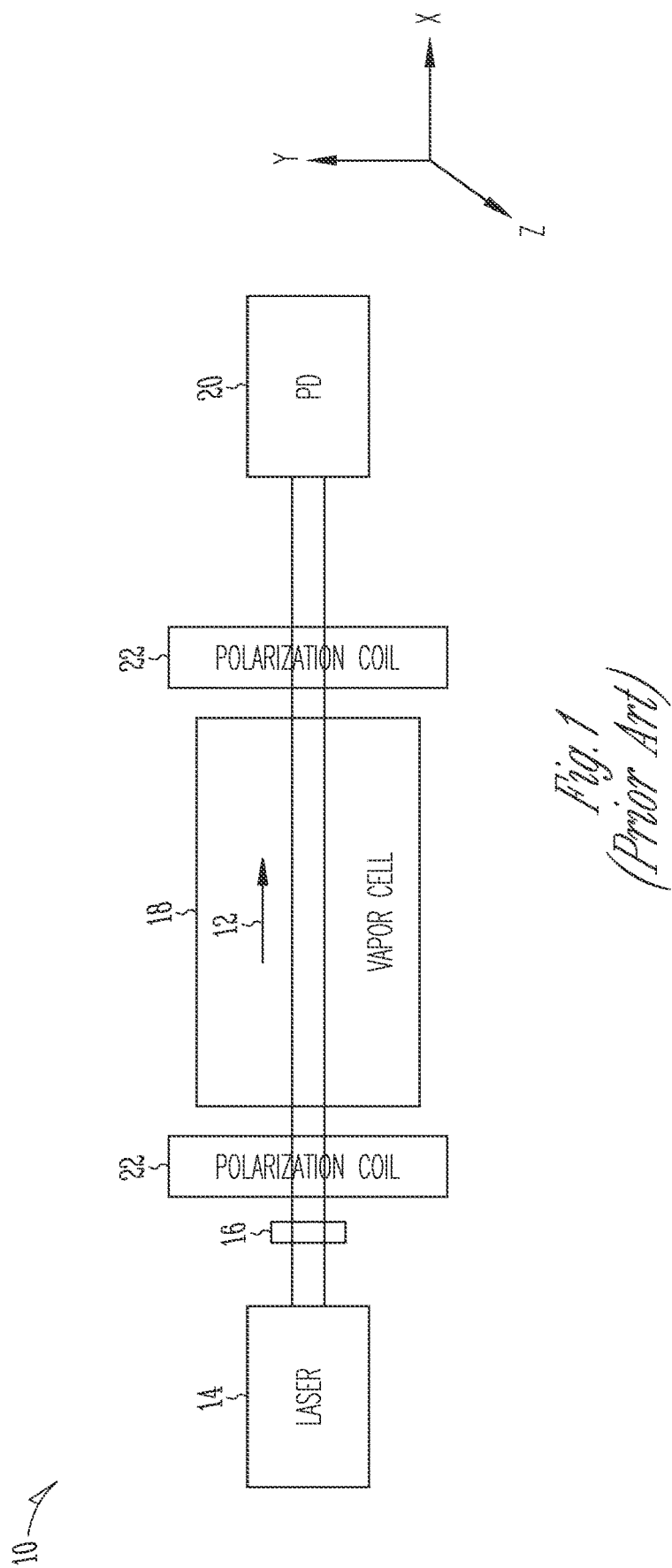
FIG. 1, as described above, is a diagram of an embodiment of an OPM.
Figure 2C:
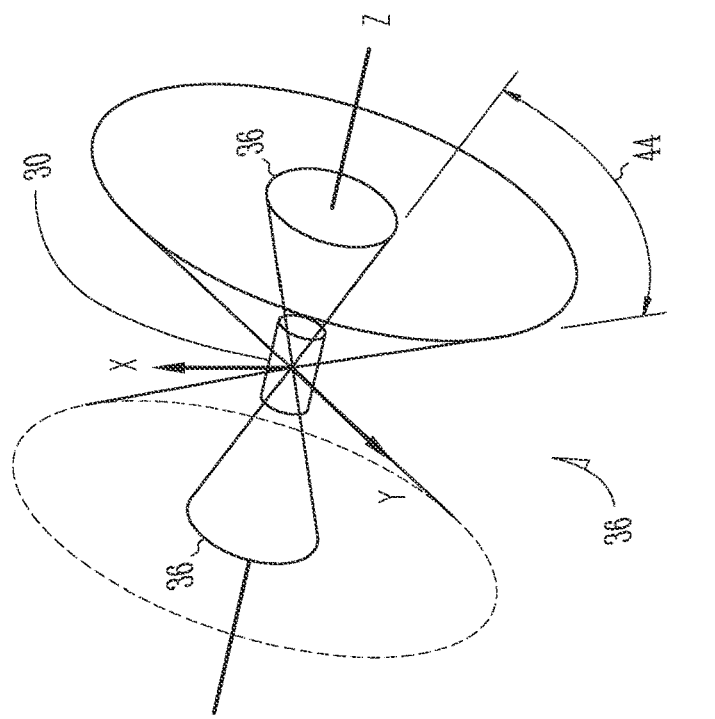
FIGS. 2A-2C, as described above, are diagrams illustrating an equatorial dead zone, a polar dead zone and an active region for different OPMs.
Figure 2B:
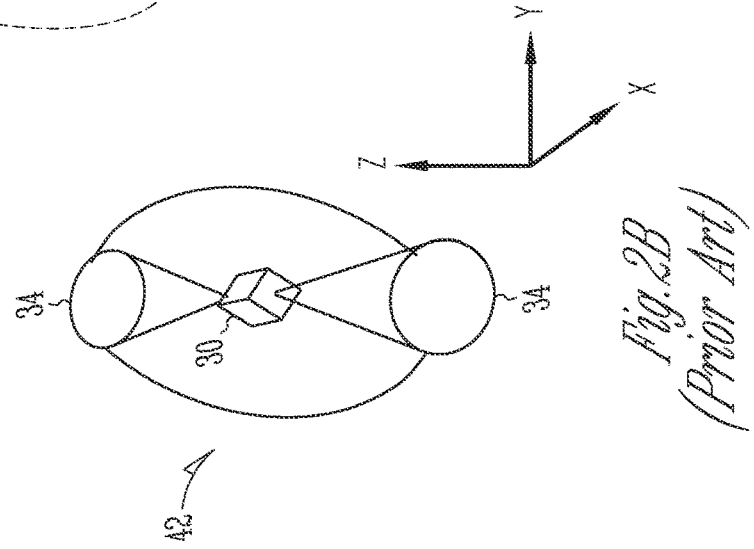
Figure 2A:
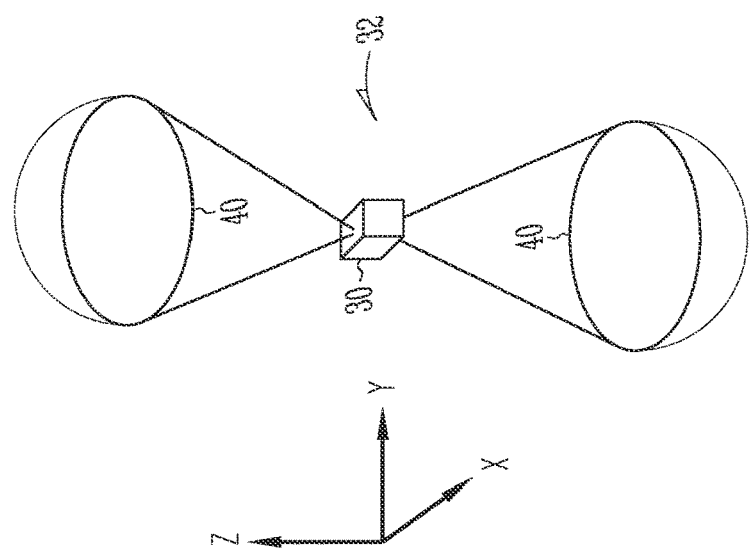
Figure 3A:
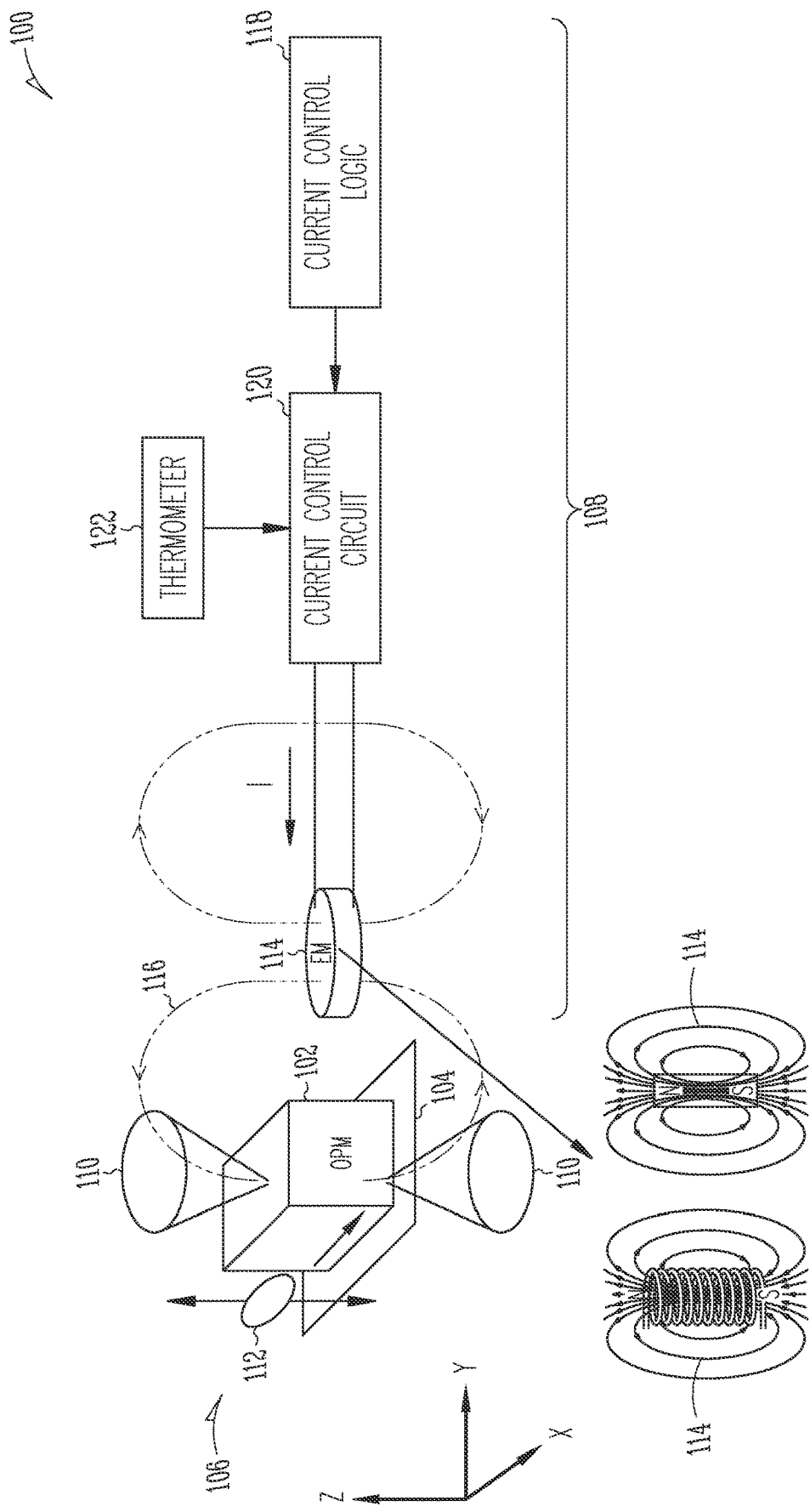
FIGS. 3A-3D are a block diagram of an embodiment of a system for bias field control of a total-field OPM that exhibits an equatorial dead zone using a single electro-magnet (EM) and top, front and side views of the OMP and EM.
Figure 3D:
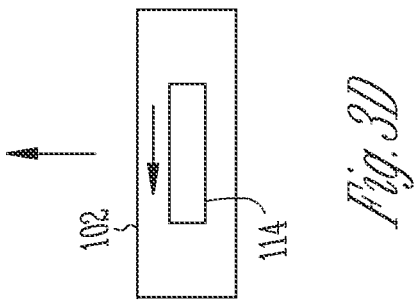
Figure 3C:
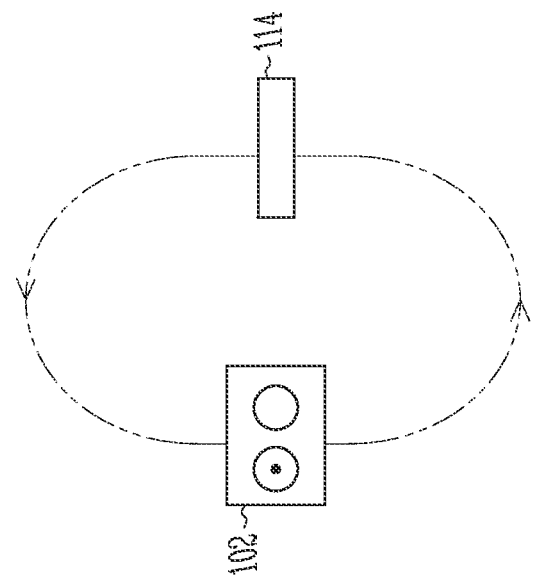
Figure 3B:
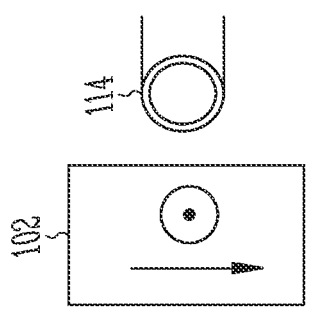
Figure 4:
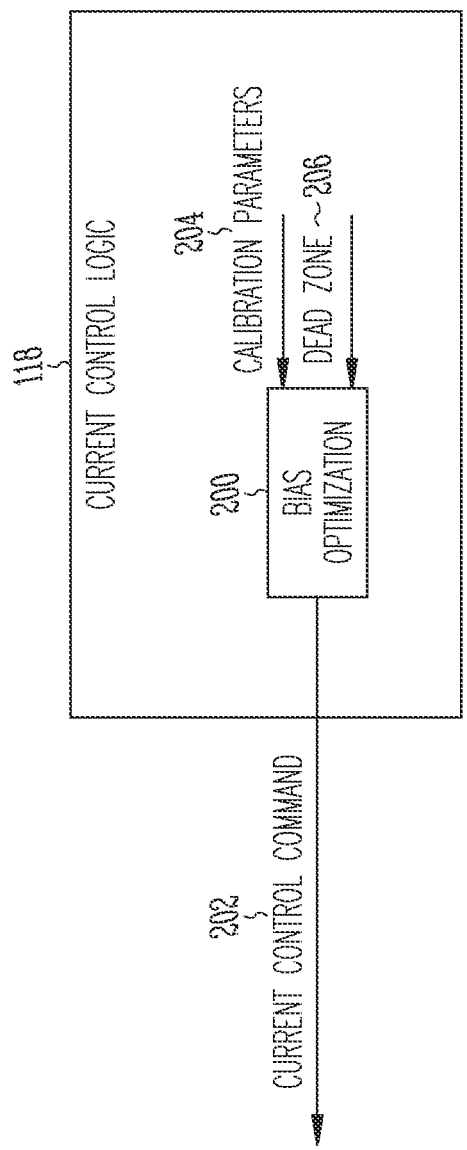
FIG. 4 is a block diagram of an embodiment of the current control logic that computes the bias based on calibration parameters for the hard and soft iron effects and the dead zone for the OPM.
Figure 5:
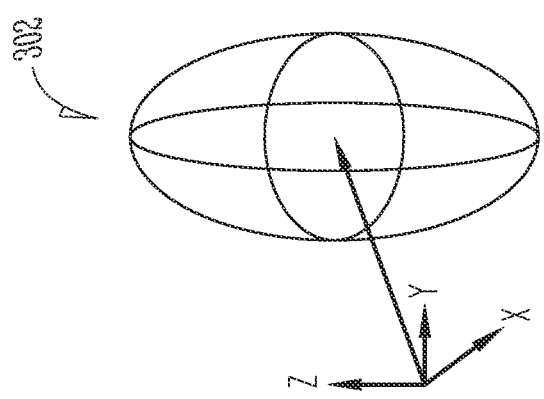
FIG. 5 is a diagram illustrating hard and soft iron effects on the vector field being measured.
Figure 5:
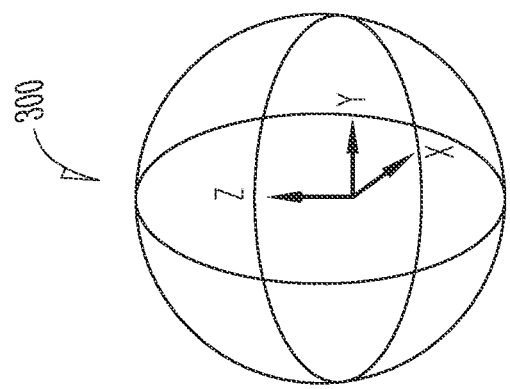

The present invention provides a controllable bias field Bbias to a single total-field OPM to maintain signal lock when an observable magnetic field Bmeas enters the OPM's dead zone. One or more EM coils are placed in proximity to the single OPM. Based on either a calibration of the field or a measured signal strength, a current command is calculated and applied to the one or more EM Coils to produce the bias field Bbias to lift the observable magnetic field Bmeas out of the dead zone. The bias level is updated at a rate sufficient to maintain signal lock without interfering with the operation of the OPM. This allows a single OPM to sense the observable magnetic field Bmeas in all directions without having to either re-orient the OPM or to use multiple orthogonally positioned OPMs. The complexity and expense of Helmholtz coil is not required to implement the controllable field bias.

Referring now to FIGS. 3A-3D, an embodiment of magnetometer 100 includes an OPM 102 mounted on a platform 104 in which the OPM exhibits an equatorial dead zone 106 and bias field control system 108 to apply a controlled bias field Bbias to lift an observable magnetic field Bmeas out of the dead zone. The bias level is updated at a rate sufficient to maintain signal lock without interfering with the operation of the OPM. This allows a single OPM with the aid of a single EM coil to sense the observable magnetic field Bmeas in all directions without having to either re-orient the OPM or to use multiple orthogonally positioned OPMs.

Per convention, the OPM's detection zone 110 is a cone about the Z-axis defined by an angle θ1 that satisfies $$\cos(\theta_1) \leq \frac{|\langle B_{meas}, \hat{Z} \rangle|}{\|B_{meas}\|}.$$

Equatorial dead zone 106 is the remaining volume that does not satisfy the inequality. In other words, it is a cone in the XY plane that is rotated about the Z-axis. An observable magnetic field Bmeas 112 in the dead zone will not be detected, or at least not detected with sufficient signal strength, to maintain signal lock.

In this embodiment, bias field control system 108 includes a single EM coil 114 positioned proximate the OPM 102 and oriented such that when energized the single EM coil produces a bias magnetic field Bbias 116 that is substantially parallel to the Z-axis in a local volume around the OPM to move a Z-component of an observable field Bmeas up or down in the Z direction to move Bmeas from the equatorial dead zone 106 into the detection zone 110. Current control logic 118 determines a level of Bbias, preferably a minimum level, to move Bmeas 112 into the detection zone. A current control circuit 120 is responsive to the determined bias level to generate a current to energize the EM coil 114. The bias field control system may be provided as an after-market add on to an existing OPM or integrated inside the OPM package. The system may be used where the OPM is mounted on a platform as shown or not.

EM coil 114 is thermally characterized by a thermal coefficient and Ohm's law. Ohm's provides V=IR, but the resistance of the EM has a temperature dependence R=R_0 (1+alpha*(T−T_0)). Copper, for example, has a coefficient of about 0.004. The characterization involves finding the field generated at a distance relative to the electromagnet given temperature and applied current. Without an accurate characterization, the measurement could be several 100 nT off when the accuracy requirements are in the single digit nanotesla. A thermometer 122 is provided to measure the temperature whereby current control circuit 120 can make the requisite compensation.

In a typical OPM such as Quspin's QTFM Gen-2, the OPM is pumped, either by an RF coil or a second laser, in the MHz range and the photo detector is read out in the hundreds of Hertz. The current control logic 118 updates the level of Bbias at a rate that is sufficient to maintain signal lock (keep Bmeas in detection zone 110) without interfering with the operation of the OPM including the pumping of the OPM, other electronics, OEM controls or exciting other physical phenomena. Very weak higher order terms of the bias update may interfere. Therefore, typically the update rate is <100 Hz, <10 Hz and often <1 Hz to maintain signal lock without inducing other interference.

Referring now to FIGS. 4, 5, 6A-D and 7A-7C, an embodiment of current control logic 118 includes bias optimization logic 200 configured to compute a current control command 202 in response to calibration parameters 204 and a definition of the dead zone 206. In an embodiment, the calibration parameters include soft iron effects M and hard iron effects C that characterize the platform.

An unimpinged magnetic field is represented by a sphere 300. Soft iron effects M, which are body attitude dependent, warp the magnetic field lines due to the surrounding material to transform the sphere 300 into an ellipsoid 302. Hard iron effects C bias the magnetic field in the body fixed frame subject to nearby magnetic material. A model of the hard and soft iron is $$B_{meas} = MRB_{truth} + C$$

The ellipsoid comes from $$B_{meas}^T B_{meas} = (MRB_{truth} + C)^T (MRB_{truth} + C) =$$

$$B_{truth}^T R^T M^T MRB_{truth} + 2C^T MRB_{truth} + C^T C$$

which is the equation of an ellipsoid with respect to $RB_{truth}$. At a point in space, $B_{truth}$ is a constant vector that can be rotated into any fashion using the attitude R; this creates a sphere of possibilities. The sphere is then transformed using hard/soft iron linear affine model to yield the offset ellipsoid. See Vasconcelos, J. F., et al. "A geometric approach to strapdown magnetometer calibration in sensor frame." *IFAC Proceedings Volumes* 41.1 (2008): 172-177.

Generally speaking, the bias optimization logic 200 is configured to compute the minimum bias, hence minimum excitation current and power, required to move Bmeas out of the dead zone and into the detection zone to establish and maintain signal lock. A "safety zone" may be defined within the detection zone to increase stability in light of small perturbations. The inclusion of the safety zone will increase the minimum bias.

In one approach, the bias optimization logic 200 determines the minimum bias for the given M and C for any possible attitude of the OPM. In other words, the minimum bias will move Bmeas for the worst case OPM attitude just inside the detection zone, or just in side the safety zone within the detection zone. For other OPM attitudes, the applied bias will move Bmeas deeper inside the detection zone.

The constrained optimization problem can be stated as:

$$\min_{b_{bias}} J(b_{bias}) B_{meas,bias} = MRB_{truth} + C +$$

$$b_{bias} \forall R \in SO(3) \varepsilon_{safety} \geq \cos(\theta_{dead}) B_{meas,3}^2 - \sin(\theta_{dead})(B_{meas,1}^2 + B_{meas,2}^2)$$

where J is an arbitrary cost function (e.g. an 11 cost function is the sum of absolute magnitude of the bias and 12 is the sum of the squares of the bias), M and C are the soft and hard iron effects of the platform (where M is a 3×3 identify matrix and C is a length 3 vector of all zeros if there are no effects), SO(3) is the special orthogonal group of order 3, θdead (also referred to as θ1) is the boundary angle that separates the dead and detection zones and εsafety defines the safety zone. To satisfy the constraint imposed by the Karush-Kuhn-Tucker (KKT) stationarity condition, the normal of the ellipsoid must be aligned with the normal to the dead zone cone (i.e. the ellipsoid must be tangent to the cone). Many solution techniques are well-known to solve constrained optimization problems.

As shown in FIGS. 6A-6D, a minimum Bbias 400 is applied to an observable magnetic field 402 to move the ellipsoid from the equatorial dead zone inside a safety zone 404 within a detection zone 406 for an OPM 408. Since the minimum Bbias 400 was optimized over all possible OPM attitudes, as the attitude of the OPM changes Bmeas remains within the safety zone 404 and signal lock is maintained.

Although this approach maintains signal lock as the OPM attitude changes, because minimum Bbias is computed and maintained for the worst case attitude the total current, hence power, required to provide the bias is greater than it would be if the minimum Bbias was computed for the measured attitude of the OPM at a given time. The tradeoff is that signal lock may be lost if the attitude changes faster than the update rate. The update rate may be able to be increased provided it does not otherwise interfere with operation of the OPM.

The constrained optimization problem for a particular attitude measurement can be stated as:

$$\min_{b_{bias}} J(b_{bias}) B_{meas,bias} =$$

$$MR_t B_{truth} + C + b_{bias} \varepsilon_{safety} \geq \cos(\theta_{dead}) B_{meas,3}^2 - \sin(\theta_{dead})(B_{meas,1}^2 + B_{meas,2}^2).$$

Figure 7C:
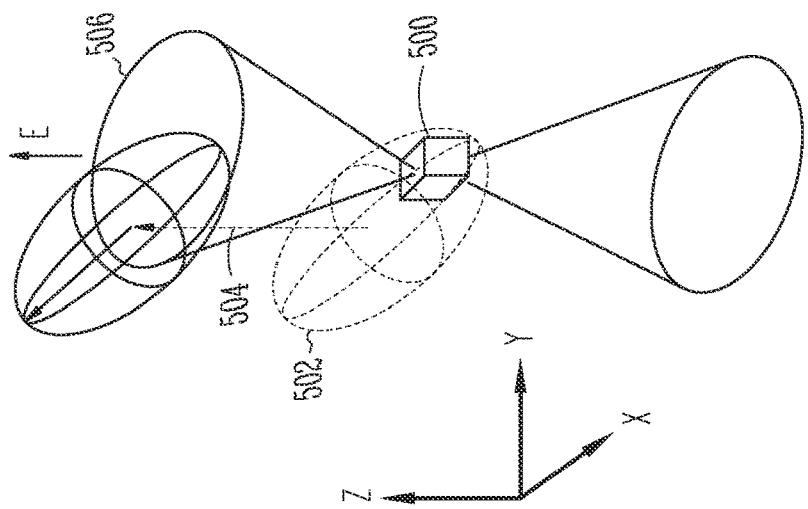
FIGS. 7A-7C are illustrations of the application of the optimized bias to move the observable magnetic field Bmeas from the equatorial dead zone into the detection zone taking attitude of the sensor into consideration.
Figure 7B:
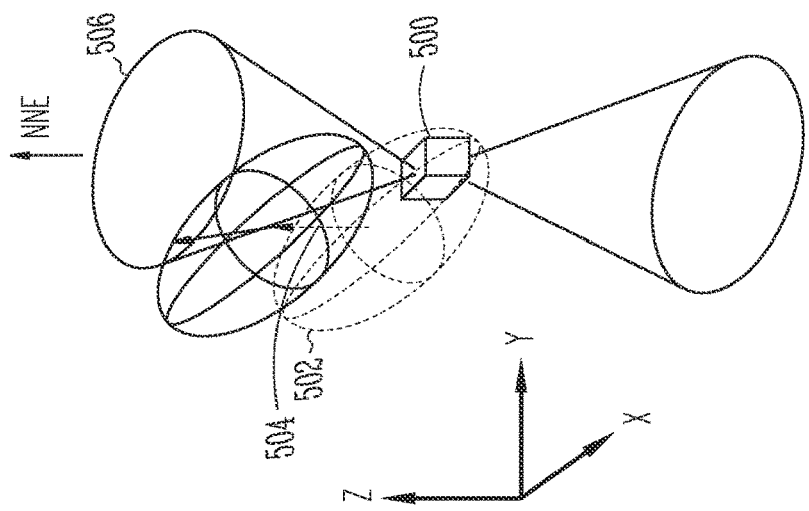
Figure 7A:
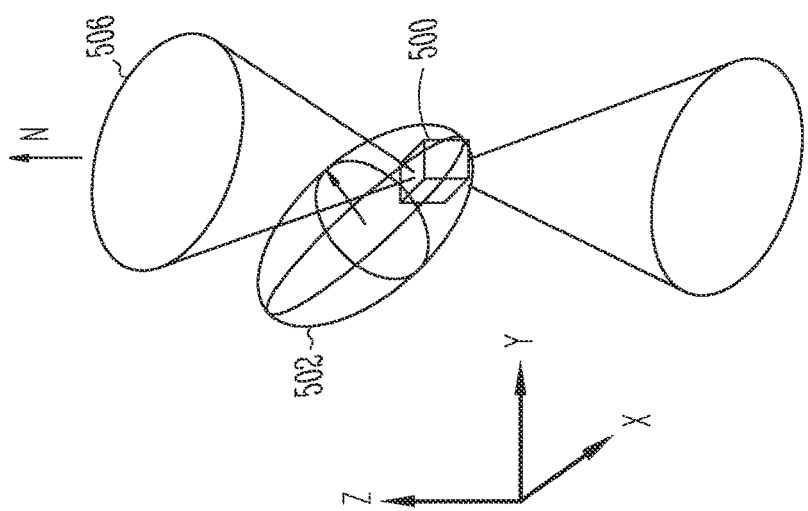
Figure 8:
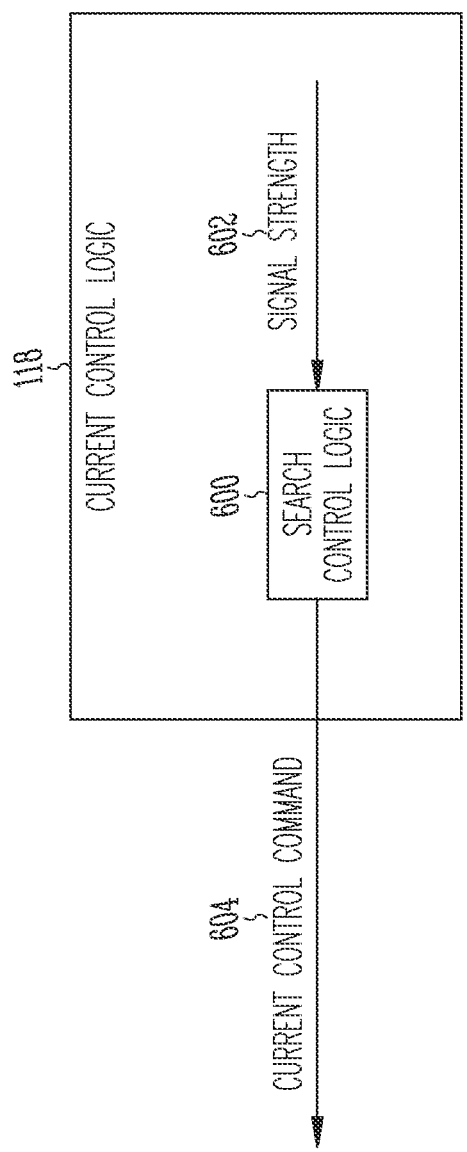
FIG. 8 is a block diagram of an embodiment of the current control logic that searches for a bias based on signal strength.

As shown in FIGS. 7A-7C, an OPM 500 is oriented N, NNE and E in Earth's magnetic field. For a N orientation, the observable magnetic field 502 lies outside the equatorial dead zone and no bias is required. For a NNE orientation, the observable magnetic field 502 lies inside the equatorial dead zone but only a small bias 504 is required to move Bmeas into detection zone B506. For a E orientation, the observable magnetic field 500 lies inside the equatorial dead zone 504 and a larger bias 504 is required.

Referring now to FIGS. 8 and 9A-9C, an embodiment of current control logic 118 includes search control logic 600 that is responsive to signal strength 602 as read out by the OPM's PD to search a space of bias levels to find a bias level that satisfies a signal strength criteria (e.g. greater than a threshold criteria (e.g. 40%) or a local maximum) and output that level as the current control command 604. The search approach has the advantages of not requiring any knowledge or computation of the calibration parameters (hard and soft iron effect M and C or OPM attitude). The search control logic simply identifies a bias level that moves Bmeas out of the dead zone. The disadvantage is the required bias will change with OPM attitude. The search is refined at the update rate to provide a bias level that satisfies the criteria. If attitude changes too rapidly and signal lock is lost the search may have restart and find a suitable bias.

For a single EM coil, the search control logic 600 searches along the axis of the applied bias field Bbias. For an equatorial dead zone, the logic will search in the positive and negative Z directions until a suitable bias is located. For a polar dead zone, the logic will suitably search in the positive and negative X or Y direction until a suitable bias is located. There are an innumerable number of different search techniques that could be employed.

In one technique, the search bounces back-and-forth between positive and negative levels of Bbias outward from minimum to maximum currents or inward from the maximum to minimum current until the signal strength criteria is satisfied. For example, if current levels between 0 and 1 are possible, the algorithm might search 0, ±0.25, ±0.5, ±0.75 and ±1.0 in to out or out to in until the criteria is satisfied.

In another technique, the search employs some type of a search routine such as a binary or PID search algorithm.

Figure 9C:
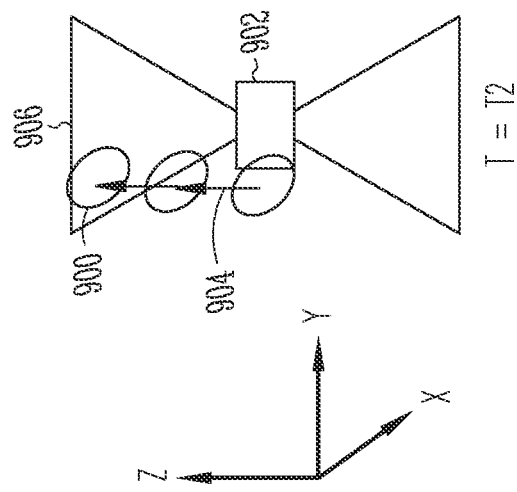
FIGS. 9A-9C are illustrations of the application of the search algorithm to move the observable magnetic field Bmeas from the equatorial dead zone into the detection zone.
Figure 9B:
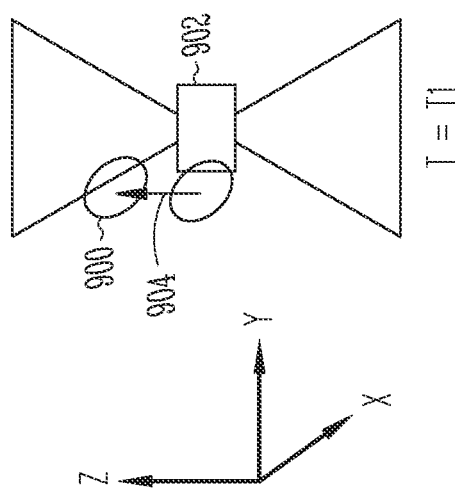
Figure 9A:
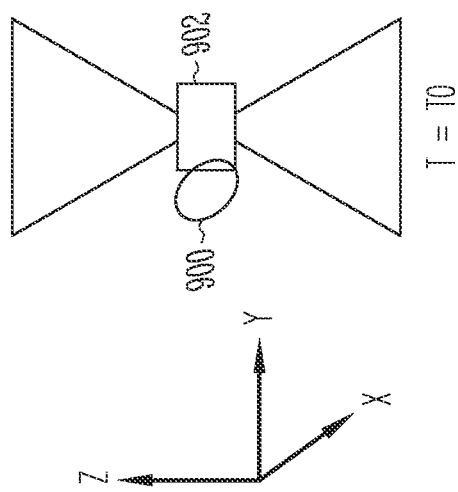

As shown in FIGS. 9A-9C, an observable measurable field Bmeas 900 is within the equatorial dead zone of an OPM 902. The search control logic 600 search bias levels 904 along the Z-axis until the signal strength satisfies the criteria at which Bmeas lies within the detection zone 906.

Figure 10:
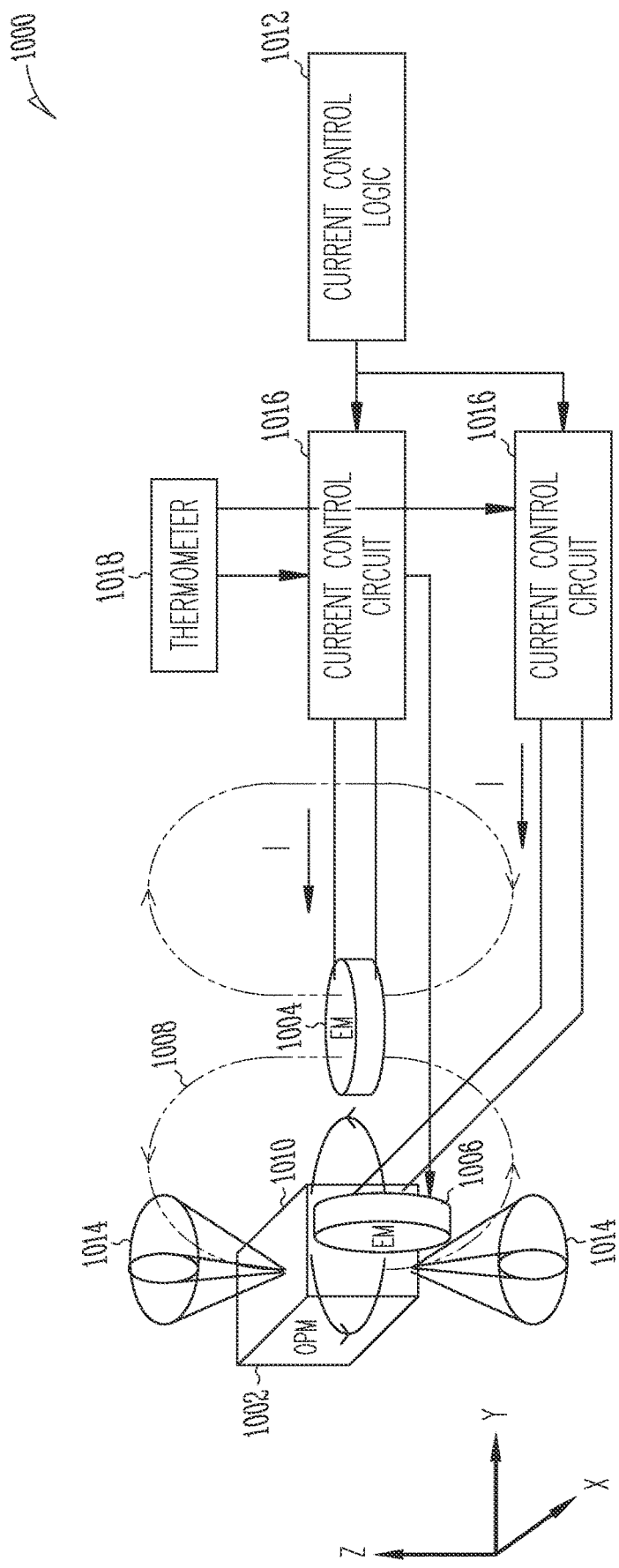
FIG. 10 is a block diagram of an embodiment of a system for bias field control of a total-field OPM that exhibits an active region using an orthogonal pair of electro-magnets.

Referring now to FIG. 10, an embodiment of a bias field control system 1000 applies a controlled bias field Bbias in two orthogonal directions to a single total-field OPM 1002. The additional capabilities offered by multiple dimensions can be used to reduce overall current requirements (e.g., reduce the minimum bias) and/or to support more complicated dead zones such as those associated with the Active Zone.

Bias field control system 1000 includes a first and second EM coils 1004 and 1006 positioned proximate the OPM 1002 and oriented such that when energized EM coil 1004 produces a bias magnetic field Bbias,3 1008 that is substantially parallel to the Z-axis in a local volume around the OPM to move a Z-component of an observable field Bmeas up or down in the Z direction and EM coil 1006 produces a bias magnetic field Bbias,2 1010 that is substantially parallel to the Y-axis (or X-axis) in the local volume to move a Y-component of Bmeas back and forth in the Y direction. Current control logic 1012 determines levels of Bbias,2 and Bbias,3, preferably a minimum total level, to move Bmeas into the conic annular region that defines a active zone 1014. Current control circuits 1016 with a thermometer 1018 is responsive to the determined bias levels to generate current to energize the EM coils 1004 and 1006. On account of the configuration of the Active Zone 1014, bias optimization for any attitude is problematic. Since the OPM attitude is unknown, the logic does not know the starting point within the dead zone and the computed bias might push Bmeas through the Active Zone into the opposing portion of the dead zone. Accordingly, either bias optimization with a calibration, attitude measurement, and/or a search protocol are suitably used to provide the bias levels.

Figure 11:
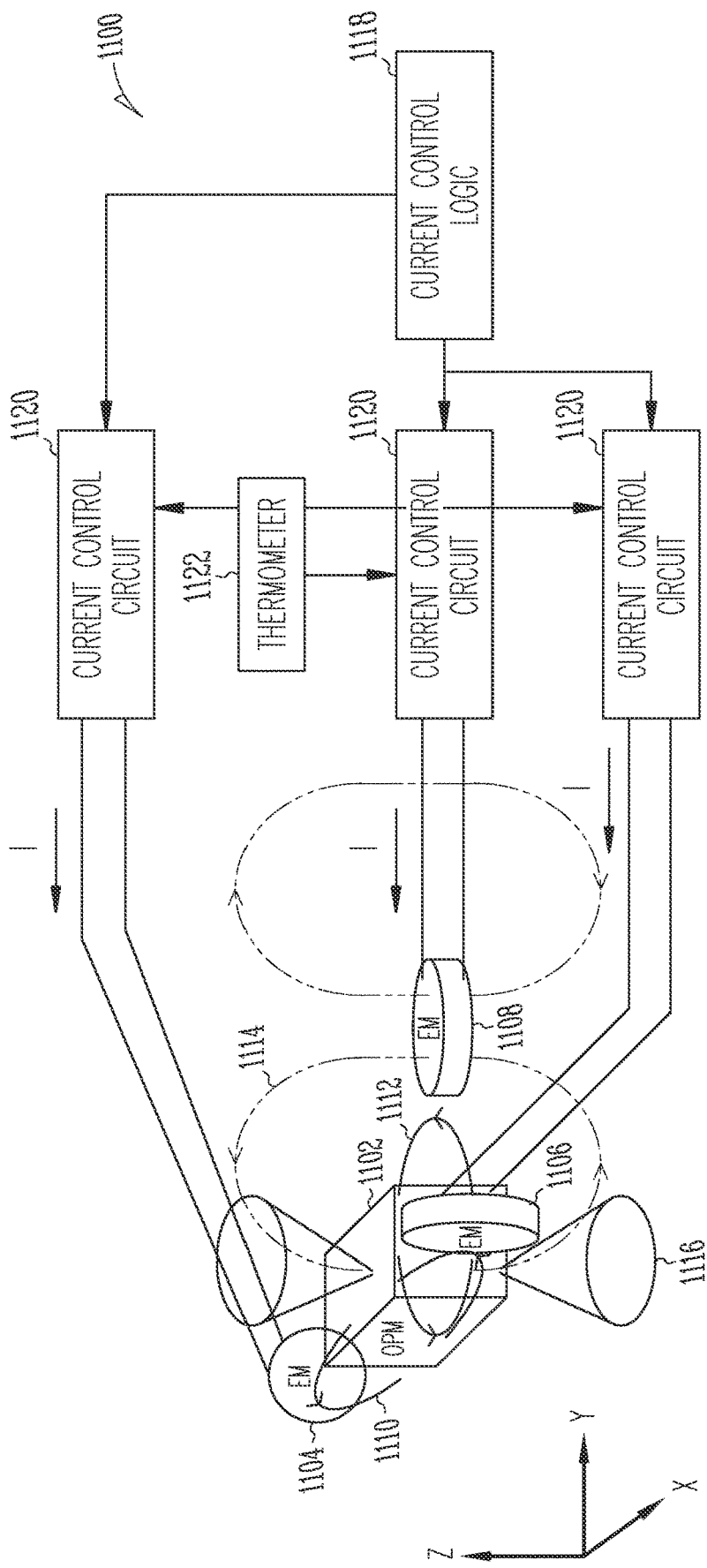
FIG. 11 is a block diagram of an embodiment of a system for bias field control of a total-field OPM using three orthogonal electro-magnets to minimize current requirements to move the observable magnetic field Bmeas from the dead zone to the detection zone.

Referring now to FIG. 11, an embodiment of a bias field control system 1100 applies a controlled bias field Bbias in three orthogonal directions to a single total-field OPM 1102. The additional capabilities offered by multiple dimensions can be used to reduce overall current requirements (e.g. reduce the minimum bias) and/or to support more complicated dead zones such as associated with the Active Zone. In this embodiment, the system is applied to minimize total bias for an equatorial dead zone.

Bias field control system 1100 includes a first, second and third EM coils 1104, 1106 and 1108 positioned proximate the OPM 1102 and oriented such that when energized the produce bias magnetic fields Bbias,1, Bbias,2 and Bbias,3 1110, 1112 and 1114, respectively, substantially parallel to Z, X and Y axes, respectively, in a local volume around the OPM to move X, Y and Z components of an observable field Bmeas back and forth along the axes to lift Bmeas out of the equatorial dead zone into a detection zone 1116. Current control logic 1118 determines levels of Bbias,1, Bbias,2, and Bbias,3, preferably a minimum total level, to move Bmeas out of the equatorial dead zone. Current control circuits 1120 with a thermometer 1122 are responsive to the determined bias levels to generate current to energize the EM coils 1104, 1106 and 1108.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:
1. A magnetometer, comprising:
a single total-field optically pumped magnetometer (OPM), said OPM having a detection zone along a detection axis and a dead zone orthogonal to the detection axis, a boundary separating the detection and dead zones defined by an angle theta θ1 from a Z-axis in an XYZ coordinate space; and
a first electromagnetic (EM) coil positioned proximate the OPM and oriented such that when energized the first EM coil produces a first bias magnetic field Bbias,1 that is substantially parallel to the detection axis in a local volume around the OPM to move an observable field Bmeas from the dead zone into the detection zone, wherein Bbias,1 is updated at a rate sufficient to maintain Bmeas in the detection zone while not interfering with operation of the OPM.

2. The magnetometer of claim 1, further comprising:
a platform on which the OPM is mounted,
current control logic responsive to calibration parameters, including soft iron M and hard iron C, that characterize the platform and a definition of the dead zone to compute the Bbias,1 to move Bmeas into the detection zone; and
current control circuit responsive to the computed bias to generate a current to energize the first EM coil.

3. The magnetometer of claim 2, wherein the current control logic computes a minimum required Bbias,1 for any possible attitude of the OPM.

4. The magnetometer of claim 2, wherein the calibration parameters include an attitude measurement of the OPM, wherein the current control logic computes a minimum required Bbias,1 for the attitude measurement.

5. The magnetometer of claim 1, wherein the OPM detects a signal responsive to Bmeas, further comprising:
current control logic that implements a search along the detection axis responsive to signal strength to determine a level of Bbias,1 that satisfies a signal strength criteria to move Bmeas into the detection zone; and
current control circuit responsive to the level of Bias,1 to generate a current to energize the first EM coil.

6. The magnetometer of claim 5, wherein the current control circuit provides currents between minimum and maximum values to energize the first EM coil, wherein the search bounces back-and-forth between positive and negative levels of Bbias,1 outward from the minimum to maximum current or inward from the maximum to minimum current until the signal strength criteria is satisfied.

7. The magnetometer of claim 5, wherein the search is performed in accordance with an optimized search algorithm.

8. The magnetometer of claim 1, wherein Bbias,1 is updated at a rate less than 100 Hz.

9. The magnetometer of claim 1, wherein Bbias,1 is updated at a rate less than 1 Hz.

10. The magnetometer of claim 1, wherein the detection axis is the Z-axis and the dead zone is an equatorial dead zone in the XY plane around the Z-axis, wherein Bbias,1 is applied parallel to the Z-axis to move a Z-component of Bmeas up or down in the Z direction to move Bmeas orthogonal to the XY plane.

11. The magnetometer of claim 1, wherein the detection axis is the Z-axis and the dead zone is an equatorial dead zone in the XY plane around the Z-axis, further comprising a conic polar dead zone about the Z-axis whereby the detection zone is an annular conic region about the Z-axis between the equatorial and polar dead zones, wherein Bbias,1 is applied parallel to the Z-axis to move the Z-component up or down in the Z direction into the annular conic region.

12. The magnetometer of claim 11, further comprising:
a second EM coil positioned proximate the OPM and oriented such that when energized the second EM coil produces a second bias magnetic field Bbias,2 substantially orthogonal to the Z-axis in the local volume, wherein application of Bbias,1 and Bias,2 move Bmeas from either the equatorial or polar dead zones into the annular conic region of the detection zone.

13. The magnetometer of claim 1, wherein the first EM coil produces Bbias, 1 in the Z-direction, further comprising second and third EM coils positioned proximate the OPM and oriented such that when energized the second and third EM coils produce second and third bias magnetic fields Bbias,2 and Bbias,3 along X and Y axes, respectively, wherein application of Bbias, 1, Bias,2 and Bbias,3 move Bmeas from the dead zones into the detection zone.

14. A magnetometer, comprising:
a single total-field optically pumped magnetometer (OPM), said OPM having a detection zone along a Z-axis and an equatorial dead zone orthogonal to the Z-axis, a boundary separating the detection and dead zones defined by an angle theta θ1 from the Z-axis in an XYZ coordinate space; and
a single electromagnetic (EM) coil positioned proximate the OPM and oriented such that when energized the single EM coil produces a bias magnetic field Bbias that is substantially parallel to the Z-axis in a local volume around the OPM to move a Z-component of an observable field Bmeas up or down in the Z direction to move Bmeas from the equatorial dead zone into the detection zone, wherein Bbias is updated at a rate sufficient to maintain Bmeas in the detection zone while not interfering with operation of the OPM.

15. The magnetometer of claim 14, further comprising:
a platform on which the OPM is mounted,
current control logic responsive to calibration parameters including soft iron M and hard iron C that characterize the platform and a definition of the dead zone to compute a minimum required Bbias to move Bmeas into the detection zone for any possible attitude of the OPM; and
current control circuit responsive to the computed bias to generate a current to energize the first EM coil.

16. The magnetometer of claim 14, further comprising:
a platform on which the OPM is mounted,
current control logic responsive to calibration parameters including soft iron M and hard iron C of the platform and an attitude measurement of the OPM and a definition of the dead zone to compute a minimum required Bbias to move Bmeas into the detection zone for the attitude measurement of the OPM; and
current control circuit responsive to the computed bias to generate a current to energize the first EM coil.

17. The magnetometer of claim 14, wherein the OPM detects a signal responsive to Bmeas, further comprising:
a platform on which the OPM is mounted,
current control logic that implements a search along the Z-axis responsive to signal strength to determine a level of Bbias,1 that satisfies a signal strength criteria to move Bmeas into the detection zone; and
current control circuit responsive to the level of Bbias,1 to generate a current to energize the first EM coil.

18. A magnetometer, comprising:
a platform;
a single total-field optically pumped magnetometer (OPM) mounted on the platform, said OPM having a detection zone along a detection axis and a dead zone orthogonal to the detection axis, a boundary separating the detection and dead zones defined by an angle theta θ1 from a Z-axis in an XYZ coordinate space;
a single electromagnetic (EM) coil positioned proximate the OPM and oriented such that when energized the first EM coil produces a bias magnetic field Bbias that is substantially parallel to the detection axis in a local volume around the OPM to move an observable field Bmeas from the dead zone into the detection zone;
current control logic responsive to calibration parameters including soft iron M and hard iron C that characterize the platform and a definition of the dead zone to compute a minimum required bias magnetic field Bbias to move Bmeas into the detection zone, wherein Bbias is updated at a rate sufficient to maintain Bmeas in the detection zone while not interfering with the operation of the OPM; and
current control circuit responsive to the computed bias to generate a current to energize the first EM coil.

19. The magnetometer of claim 18, wherein the current control logic computes the minimum required Bbias for any possible attitude of the OPM.

* * * * *

UNITED STATES PATENT AND TRADEMARK OFFICE
CERTIFICATE OF CORRECTION

PATENT NO. : 11,965,943 B2  
APPLICATION NO. : 17/722017  
DATED : April 23, 2024  
INVENTOR(S) : Choroszucha et al.

Page 1 of 2

It is certified that error appears in the above-identified patent and that said Letters Patent is hereby corrected as shown below:

On the Title Page

In Column 2, item (57) Abstract, Line 7, delete "coils" and insert --EM coils-- therefor In the Specification In Column 1, Line 17, delete "mangnetomer" and insert --magnetometer-- therefor In Column 1, Line 29, delete "sensors" and insert --sensors;-- therefor In Column 1, Line 59, delete "special" and insert --a special-- therefor In Column 2, Line 6, delete "STEM" and insert --STFM-- therefor In Column 2, Line 7, delete "(HD)" and insert --(FID)-- therefor In Column 2, Line 8, delete "www.quspin.com," and insert --www.quspin.com.-- therefor In Column 2, Line 12, delete "VCSEL," and insert --VCSEL-- therefor In Column 2, Line 58, delete "sensor" and insert --sensor 30-- therefor In Column 7, Line 35, delete "unimpinged" and insert --unimpeded-- therefor In Column 8, Line 5, delete "in side" and insert --inside-- therefor In Column 8, Line 64, delete "500" and insert --502-- therefor Signed and Sealed this  
Twenty-eighth Day of January, 2025

Coke Morgan Stewart  
*Acting Director of the United States Patent and Trademark Office*

CERTIFICATE OF CORRECTION (continued)
U.S. Pat. No. 11,965,943 B2

In the Claims

In Column 11, Line 47, in Claim 13, delete "Bbias, 1" and insert --Bbias,1-- therefor In Column 11, Line 52, in Claim 13, delete "Bbias, 1," and insert --Bbias,1,-- therefor